(12) United States Patent
Shibata et al.

(10) Patent No.: US 7,489,030 B2
(45) Date of Patent: Feb. 10, 2009

(54) STACKED SEMICONDUCTOR DEVICE

(75) Inventors: Kayoko Shibata, Tokyo (JP); Hiroaki Ikeda, Tokyo (JP); Yoshihiko Inoue, Tokyo (JP); Hitoshi Miwa, Tokyo (JP); Tatsuya Ijima, Kanagawa (JP)

(73) Assignee: Elpida Memory, Inc., Tokyo (JP)

( * ) Notice: Subject to any disclaimer, the term of this patent is extended or adjusted under 35 U.S.C. 154(b) by 242 days.

(21) Appl. No.: 11/635,500

(22) Filed: Dec. 8, 2006

(65) Prior Publication Data

US 2007/0132085 A1 Jun. 14, 2007

(30) Foreign Application Priority Data

Dec. 8, 2005 (JP) ............... 2005-354807

(51) Int. Cl.
*H01L 23/02* (2006.01)
(52) U.S. Cl. ...................... 257/686; 257/724
(58) Field of Classification Search ........... 257/723, 257/724, 686, 777, 173
See application file for complete search history.

(56) References Cited

U.S. PATENT DOCUMENTS

| 5,786,628 | A | * | 7/1998 | Beilstein et al. | ........... 257/684 |
| 6,711,810 | B2 | * | 3/2004 | Buley et al. | ........... 29/830 |
| 6,838,775 | B2 | * | 1/2005 | Takahashi | ........... 257/778 |
| 7,067,914 | B2 | * | 6/2006 | Malinowski et al. | ........... 257/723 |
| 2003/0113990 | A1 | * | 6/2003 | Grube et al. | ........... 438/612 |
| 2005/0161794 | A1 | * | 7/2005 | Kato et al. | ........... 257/686 |
| 2005/0239347 | A1 | * | 10/2005 | Chamberlin et al. | ........... 439/874 |

FOREIGN PATENT DOCUMENTS

| JP | 2004-095799 | 3/2004 |
| JP | 2004-152810 | 5/2004 |
| JP | 2004-152811 | 5/2004 |
| JP | 2004-152812 | 5/2004 |
| JP | 2004-327474 | 11/2004 |
| WO | WO 97/11492 | 3/1997 |

* cited by examiner

*Primary Examiner*—S. V Clark
(74) *Attorney, Agent, or Firm*—Young & Thompson

(57) ABSTRACT

As a defective contact recovery elements, a stacked semiconductor device include a parallel arrangement system in which signal paths are multiplexed, and a defective contact recovery circuit operable to switch a signal path into an auxiliary signal path. The parallel arrangement system is used in a case where the number of signals is small and a very high speed operation is required because of a serial data transfer. The defective contact recovery circuit is used in a case where the number of signals is large because of a parallel data transfer.

13 Claims, 9 Drawing Sheets

STACKED SEMICONDUCTOR DEVICE

This application claims priority to prior Japanese patent application JP 2005-354807, the disclosure of which is incorporated herein by reference.

BACKGROUND OF THE INVENTION

1. Field of the Invention

The present invention relates to a stacked semiconductor device, and more particularly to a stacked semiconductor device having a defective contact recovery means for recovering a defective contact between stacked semiconductor chips.

2. Description of the Related Art

Recently, semiconductor memory devices including a dynamic random access memory (DRAM) have increasingly been required to have a larger memory capacity and to operate at a higher speed. An increase of a memory capacity of semiconductor memory devices has been achieved mainly by reduction of a memory cell size and enlargement of a chip size. However, the reduction of a memory cell size has a physical limitation. Further, the enlargement of a chip size causes a lowered yield and prevents a speed-up of a semiconductor memory device. Thus, a stacked semiconductor device having a plurality of stacked semiconductor chips has been proposed to fundamentally resolve the above problems. Such a stacked semiconductor device has semiconductor substrates and through electrodes extending through the semiconductor substrates for electrically connecting semiconductor chips to each other. With a plurality of stacked semiconductor chips, it is possible to achieve an increase of a memory capacity and a compactness of a semiconductor device.

There has been proposed a method of stacking core chips with a memory cell and an interface chip with a peripheral circuit for the memory cell, and transmitting and receiving signals via through electrodes extending through the chips (see Patent Document 1: Japanese laid-open patent publication No. 2004-327474). With this method, a semiconductor memory device, which has heretofore had one chip, is divided into a plurality of chips. Accordingly, it is possible to remarkably reduce a size of each chip. Thus, this method is expected to achieve a higher yield and a larger memory capacity of a semiconductor memory device. Further, an interface portion can be manufactured by a logic process. Generally, a transistor manufactured by a logic process can operate at a speed higher than a transistor manufactured by a memory process. Therefore, circuits in the interface portion can operate at a high speed. As a result, it is possible to achieve a speed-up of a semiconductor memory device.

FIG. 1 shows such a stacked semiconductor device. The stacked semiconductor device shown in FIG. 1 comprises an interface chip 102, a plurality of core chips 101a to 101c, and an interposer 100. Each of the core chips 101a, 101b, and 101c has a large number of memory cells such as DRAMs, a circuit for storing data in the memory cells, and a control circuit for the memory cells and the aforementioned circuit. Specifically, each of the core chips 101a, 101b, and 101c includes circuits such as a sense amplifier and an address decoder as peripheral circuits of the memory cells, a control circuit for adjusting operation timing of those circuits, an input/output circuit for the interface chip 102, a circuit required for determination of non-defective products in a wafer test for core chips, and the like. Further, each of the core chips 101a, 101b, and 101c has through electrodes 12 extending through the chip.

The interface chip 102 includes an external input/output circuit 16 and an internal signal input/output circuit 15 formed thereon. The external input/output circuit 16 is operable to perform a data transfer with an external terminal 103. The internal signal input/output circuit 15 includes an address buffer, a refresh counter, and the like and is operable to perform a data transfer with the core chips 101a to 101c. Thus, the interface chip 102 serves to relay an external signal to the core chips 101a, 101b, and 101c and relay a signal from the core chips 101a, 101b, and 101c to an exterior of the semiconductor device. The interposer 100 has an external terminal 103 formed on a rear face of the interposer 100, a metal interconnection 30 formed on a substrate, and a means for connecting a contact portion of the core chip 101c to the external terminal 103 via the metal interconnection 30 on the substrate.

In FIG. 1, the core chips 101a, 101b, and 101c are stacked on the interposer 100. The interface chip 102 is stacked on the uppermost core chip 101a. The respective layers (chips) are connected to each other by contact portions 11 between the chips and the through electrodes 12. External signals are transmitted and received through a signal path 1 connected to the external terminal 103 formed on the interposer 100. Internal signals are transmitted and received through a signal path 2 connected to the interface chip 102 and interiors of the core chips 101a to 101c. In the stacked core chips 101a to 101c, the through electrodes 12 of the chips are connected to each other by the contact portions 11 between the chips. Accordingly, the through electrodes 12 and the contact portions 11 between the chips, which form each signal path, are collectively referred to as a contact group. The contact portions 11 between the chips may employ solder balls or the like.

In a stacked semiconductor device, when a plurality of semiconductor chips are stacked, a defective contact may be produced by faults of through electrodes extending through the chips or faults of contact portions connecting the chips to each other. Even though each of the semiconductor chips is a non-defective product, a stacked semiconductor device becomes a defective product if one defective contact is produced in the stacked semiconductor device. This problem is caused by the fact that a defective contact cannot be repaired so as to revive a stacked semiconductor device.

A plurality of chips are bonded to each other by a solder ball or the like to produce a stacked semiconductor device. If the bonded chips are separated from each other, the fused solder ball is attached to the through electrodes of the chips. Technology of completely removing the attached solder ball or technology of re-stacking the chips to which the solder ball is attached has not been established yet. Accordingly, in a stacked semiconductor device having a plurality of stacked chips, the stacked semiconductor device may be determined to be defective because of one defective contact. In other words, all of the stacked chips are determined to be defective. Thus, a yield of stacked semiconductor devices is problematically decreased.

Further, Japanese laid-open patent publication No. 2004-152811 (Patent Document 2), Japanese laid-open patent publication No. 2004-152812 (Patent Document 3), International publication No. WO97/11492 (Patent Document 4), Japanese laid-open patent publication No. 2004-095799 (Patent Document 5), and Japanese laid-open patent publication No. 2004-152810 (Patent Document 6) refer to a stacked semiconductor device. Patent Document 2 discloses through electrodes connecting between only a portion of semiconductor chips when locations of the through electrodes are different in stacked semiconductor chips. Patent Document 3 discloses a plurality of through electrodes having different permissible current capacities for one signal. Patent Document 4 discloses removing a defective macro portion in a semiconductor chip and bonding a recovery macro at the removed portion by a metal thin film. Patent Document 5 discloses inserting a wiring base material between stacked semiconductor chips and supplying a signal from an interlayer wiring line via the wiring base material to the semiconductor chips. Patent Document 6 discloses through electrodes having varied cross-sectional areas for a power source, for a ground, and for a signal.

Thus, the above-mentioned references disclose a variety of technologies for a stacked semiconductor device. However, these references fail to disclose the problem that a yield of a stacked semiconductor device having a plurality of stacked chips is lowered by only one defective contact. The above-mentioned references do not consider such a problem and do not provide any technical suggestion to solve the problem.

SUMMARY OF THE INVENTION

As described above, a stacked semiconductor device having stacked semiconductor chips with through electrodes has a problem that a yield of stacked semiconductor devices is decreased by a defective contact upon stacking. The present invention has been made in view of this problem. It is, therefore, an object of the present invention to provide a stacked semiconductor device which is capable of recovering a defective contact produced upon stacking and achieving a high yield.

As a defective contact recovery means, a stacked semiconductor device include a parallel arrangement system in which signal paths are multiplexed, and a defective contact recovery circuit operable to switch a signal path into an auxiliary signal path. The parallel arrangement system is used in a case where the number of signals is small and a very high speed operation is required because of a serial data transfer. The defective contact recovery circuit is used in a case where the number of signals is large because of a parallel data transfer. Thus, by using a plurality of defective contact recovery means, the stacked semiconductor device can obtain a suitable recovery efficiency.

In order to resolve the above-mentioned problems, the present invention basically adopts the following technology. As a matter of course, the present invention covers applied technology in which various changes and modifications are made therein without departing from the spirit of the present invention.

According to an aspect of the present invention, there is provided a stacked semiconductor device which can recover a defective contact produced upon stacking and can achieve a high yield. The stacked semiconductor device has core chips, an interface chip, and an interposer. The stacked semiconductor device includes a defective contact recovery means, having an auxiliary recovery signal path for signal paths formed by through electrodes extending through the core chips and contact portions between the through electrodes of the core chips.

The defective contact recovery means may comprise a parallel arrangement system in which the auxiliary recovery signal path is provided for one line of the signal paths.

The parallel arrangement system may be applied to a signal inputted from an exterior of the stacked semiconductor device.

The parallel arrangement system may be applied to a signal transmitted as serial data between an external terminal and the interface chip.

The defective contact recovery means may comprise a defective contact recovery circuit system in which the auxiliary recovery signal path is provided for n lines (n: an integer larger than 0) of the signal paths and the signal paths are switched by a defective contact recovery circuit.

The defective contact recovery circuit may be mounted on the core chips.

The defective contact recovery circuit may include a latch circuit for memorizing a defective contact portion, a change-over switch, and a control circuit.

The defective contact recovery circuit system may be applied to a signal having a large number of lines between the interface chip and the core chips.

The defective contact recovery circuit system may be applied to a signal which is subjected to a parallel conversion between the interface chip and the core chips and is to be transmitted to an exterior of the stacked semiconductor device.

Different defective contact recovery means may be used for the signal paths in the stacked semiconductor device.

A parallel arrangement system may be used as the defective contact recovery means for a signal path to an input/output circuit connected to an external terminal, and a defective contact recovery circuit may be used as the defective contact recovery means for a signal path to an input/output circuit connected to the core chips.

The core chips may have a memory cell of a DRAM and a peripheral circuit of the memory cell. The interface chip may have an external input/output circuit connected to an external terminal and an internal signal input/output circuit connected to the core chips. A parallel arrangement system may be used as the defective contact recovery means for a signal path to the external input/output circuit. A defective contact recovery circuit may be used as the defective contact recovery means for a signal path to the internal signal input/output circuit.

The stacked semiconductor device may comprise a DDR type DRAM operable to input and output a data signal having a burst length of at least 2.

A stacked semiconductor device according to the present invention has a plurality of defective contact recovery means for recovering a-defective contact. As a defective contact recovery means, the stacked semiconductor device include a parallel arrangement system in which signal paths are multiplexed, and a defective contact recovery circuit operable to switch a signal path into an auxiliary signal path. The parallel arrangement system is used in a case where the number of signals is small and a very high speed operation is required because of a serial data transfer. The defective contact recovery circuit is used in a case where the number of signals is large because of a parallel data transfer. Thus, by using a plurality of defective contact recovery means, the stacked semiconductor device can obtain a suitable recovery efficiency.

The above and other objects, features, and advantages of the present invention will be apparent from the following description when taken in conjunction with the accompanying drawings which illustrate preferred embodiments of the present invention by way of example.

DESCRIPTION OF THE PREFERRED EMBODIMENTS

A stacked semiconductor device according to embodiments of the present invention will be described below with reference to FIGS. 2 to 10.

EXAMPLE 1

Figure 1:
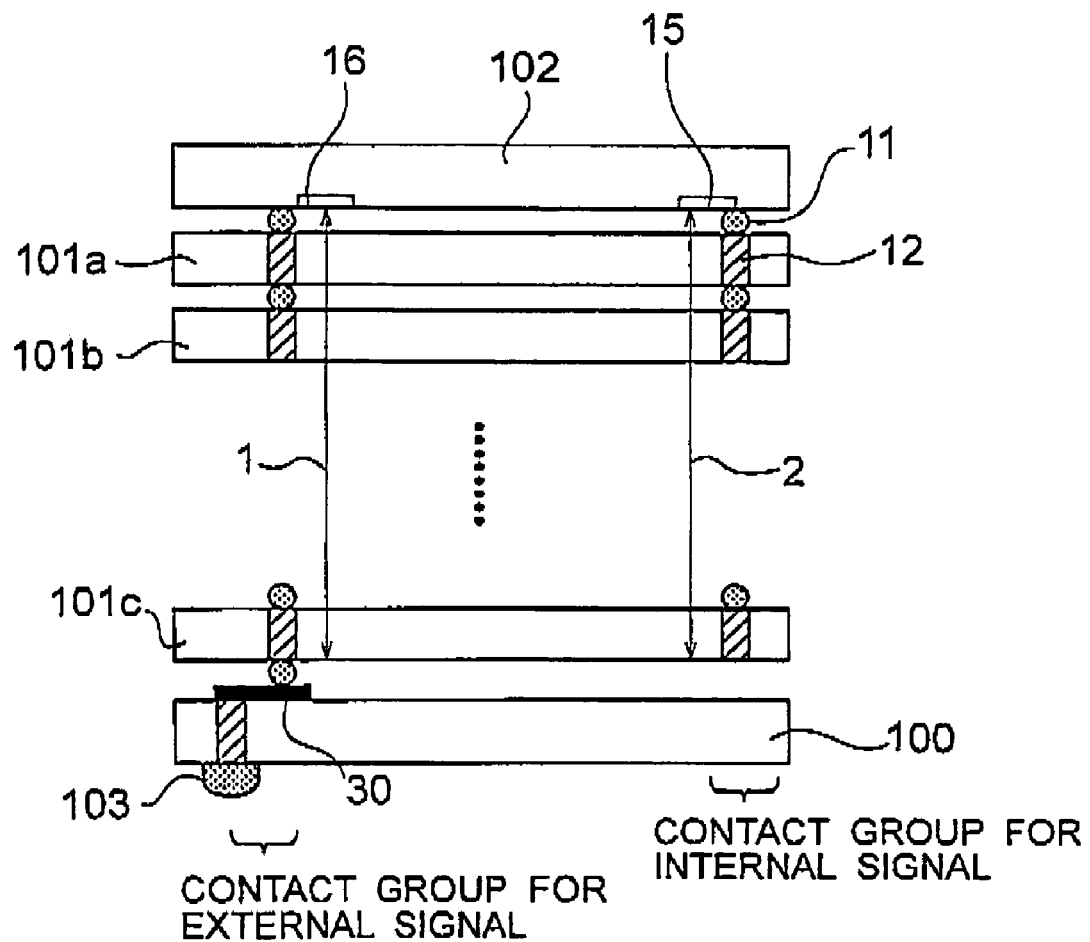
FIG. 1 is a cross-sectional view showing an example of a stacked semiconductor device.
Figure 2:
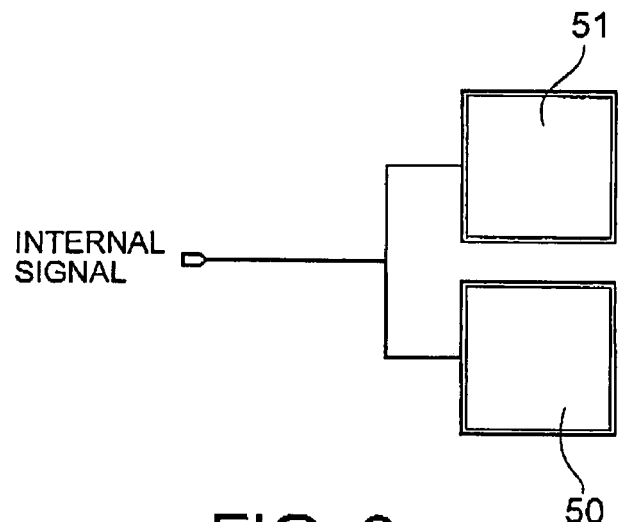
FIG. 2 is an explanation diagram showing a recovery system in which two through electrodes are provided as a defective contact recovery means in parallel to each other.
Figure 3:
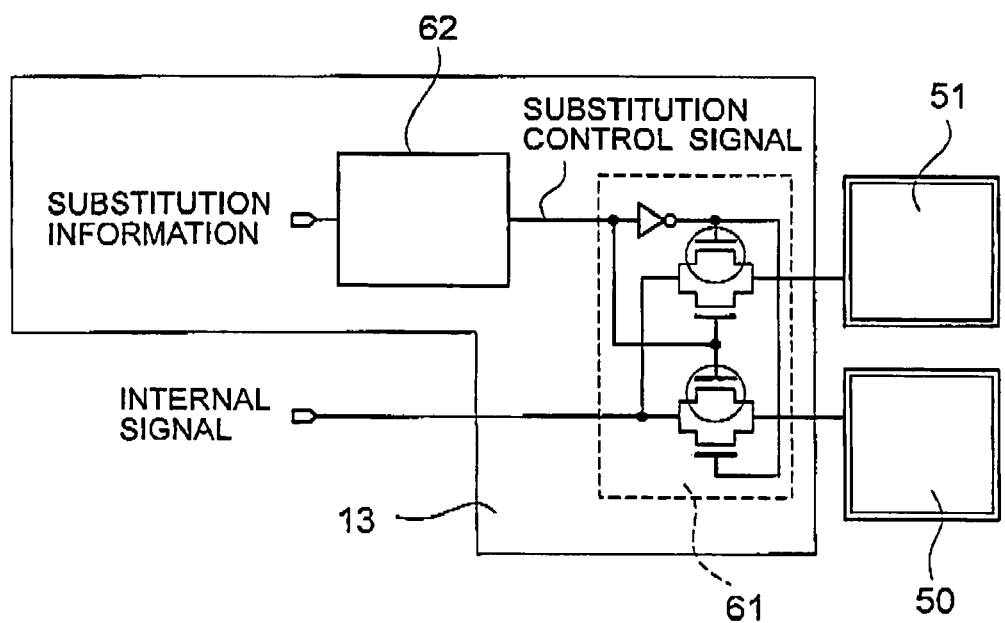
FIG. 3 is an explanation diagram showing a recovery system in which one auxiliary through electrode is provided as a defective contact recovery means for one primarily used through electrode and the electrodes are switched by a defective contact recovery circuit.
Figure 4:
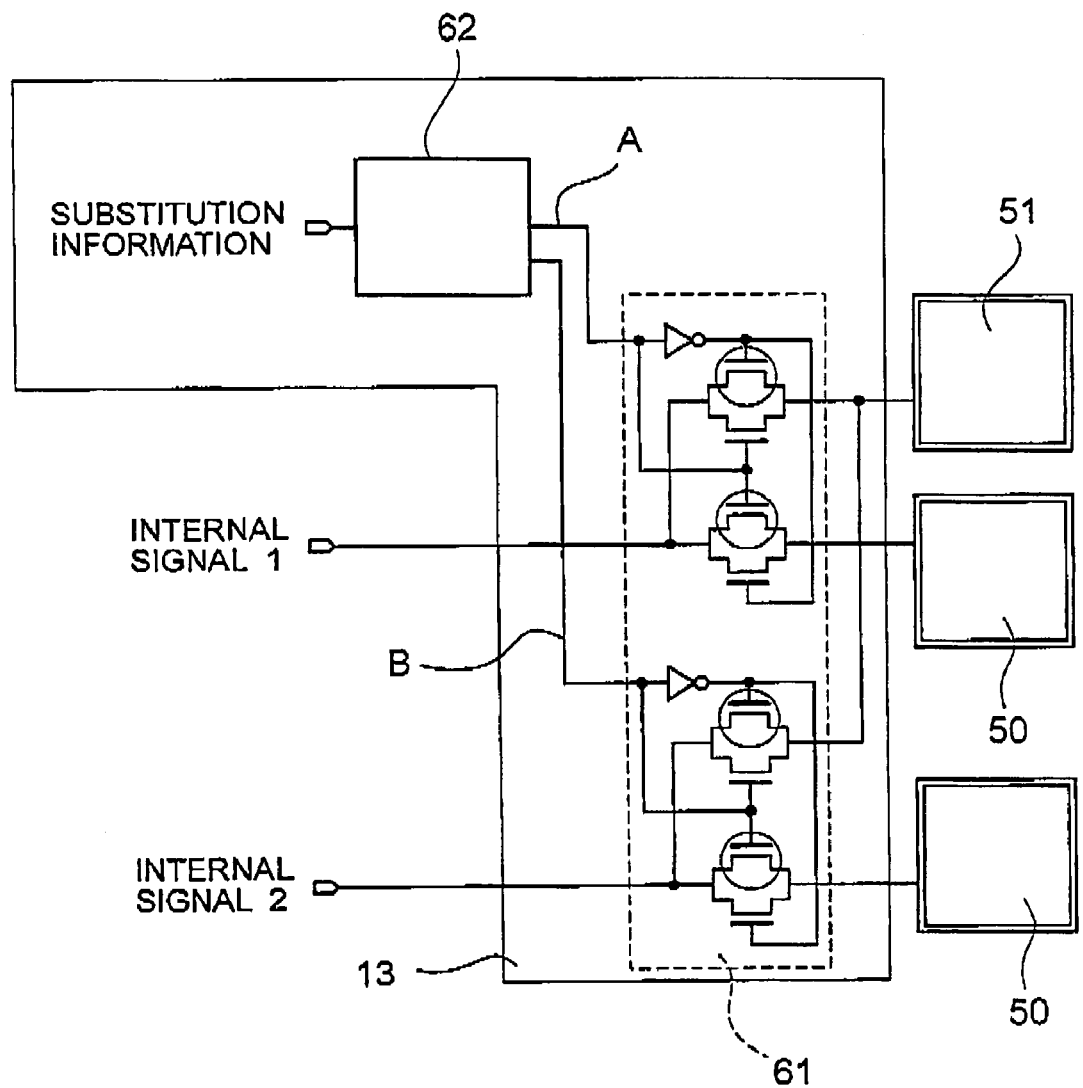
FIG. 4 is an explanation diagram showing a recovery system in which one auxiliary through electrode is provided as a defective contact recovery means for two primarily used through electrodes and the electrodes are switched by a defective contact recovery circuit.

A basic configuration of a defective contact recovery means of through electrodes in Example 1 will be described with reference to FIGS. 2 to 4. FIG. 2 shows a recovery system in which one auxiliary through electrode 51 is provided as a defective contact recovery means for one signal line and arranged in parallel to a primary through electrode 50. FIG. 3 shows a recovery system in which one auxiliary through electrode 51 is provided for one signal line and a defective contact recovery circuit 13 is used to switch between a primary through electrode 50 and the auxiliary through electrode 51. FIG. 4 shows a recovery system in which one auxiliary through electrode 51 is provided for a plurality of signal lines and a defective contact recovery circuit 13 is used to switch between primary through electrodes 50 and the auxiliary through electrode 51.

The defective contact recovery means include a parallel arrangement recovery system using the same signal contact groups arranged in parallel to each other and a recovery system using a defective contact recovery circuit. In a parallel arrangement recovery system, an auxiliary through electrode is provided for a primary through electrode, and the two through electrodes are arranged in parallel to each other. Since the two through electrodes are arranged in parallel to each other, even if a defective contact is produced in one of signal paths, a signal can be transmitted via another signal path. A defective contact recovery circuit is operable to perform a control to switch a through electrode that has become unusable due to a defective contact into an auxiliary through electrode, which is separately provided. In this case, a ratio of an prepared auxiliary through electrode to the number of primary through electrodes can be 1: n (n is an integer larger than 0). If a defective contact is produced in a primary signal path, a signal is transmitted via an auxiliary signal path.

The defective contact means an open defect. Core chips and an interface chip are tested and confirmed to be non-defective products before they are stacked. However, the test is conducted on one side of electrodes, and an open defect in the middle of the through electrodes cannot be detected. An open defect can be detected if adjacent through electrodes are short-circuited. Many open defects are caused at contact portions between the chips by insufficient contact. Thus, it is possible to remarkably improve a yield of stacked semiconductor devices by recovering open defects of defective contacts.

FIG. 2 shows a first defective contact recovery means of a parallel arrangement recovery system using the same signal contact groups arranged in parallel to each other. An internal signal is transmitted and received via through electrodes and contact portions between chips. The internal signal is connected to a signal contact group of an auxiliary through electrode 51 and a signal contact group of a primarily used through electrode 50, respectively. In this system, a defect can simply be recovered without a complicated control circuit. However, one additional signal contact group is required for recovery of one signal contact group. When this system is to be applied to all signal contact groups, twofold signal contact groups are needed, which is undesirable in view of an efficiency of a chip area.

In a second defective contact recovery means, one auxiliary signal contact group is provided for one signal contact group, and a defective contact recovery circuit is used to switch the signal contact groups. The defective contact recovery circuit requires a control circuit for bypassing a defective contact portion and a change-over switch. FIG. 3 shows an example of a circuit according to this system. An internal signal is transmitted and received via through electrodes. In this circuit example, the internal signal is inputted to the defective contact recovery circuit 13. The defective contact recovery circuit 13 includes a change-over switch 61 and a substitution control circuit 62. The change-over switch 61 switches between use of the auxiliary through electrode 51 and use of the primarily used through electrode 50 in accordance with a substitution control signal based on substitution information. The substitution information initially selects a signal contact group of the primarily used through electrode 50. If a defective contact is produced in the primarily used through electrode 50, the substitution information switches to a signal contact group of the auxiliary through electrode 51 so as to recover the defective contact.

In the system using a defective contact recovery circuit, the change-over switch 61 is connected directly to the through electrodes. Accordingly, the change-over switch 61 is a circuit element that would be influenced at first by the exterior of the chips at the time of assembly such as stacking. Thus, an insertion of an ESD protective element is considered to be necessary. An insertion of an ESD protective element causes an increase of a capacity of a signal line or an increase of a chip area due to a space required for the element. The defective contact recovery system using a defective contact recovery circuit can be formed by various circuits or means other than the circuit shown in FIG. 3. In any case, it is necessary to provide a control circuit for controlling the change-over switch and a latch circuit for memorizing defective contact portions. As compared to a parallel arrangement recovery system, an extra space is required around the through electrodes for such control circuits, and a control process becomes complicated.

In a third defective contact recovery means, one auxiliary signal contact group is provided for a plurality of signal contact groups, and a defective contact recovery circuit is used to switch the signal contact groups. The third defective contact recovery system is an improvement of the aforementioned second defective contact recovery system. The number of control circuits can be reduced so that a smaller space is required for the control circuits. FIG. 4 shows a circuit example of the third defective contact recovery means. In FIG. 4, one auxiliary signal contact group is provided for two signal contact groups. Switching to the auxiliary signal contact group is conducted by two substitution control signals A and B. It is possible to prevent an increase of a chip area by using one recovery signal contact group for a plurality of signal contact groups.

As described above, the defective contact recovery means include a parallel arrangement recovery system using the same signal contact groups arranged in parallel to each other and a recovery system using a defective contact recovery circuit. A defective contact can be recovered by using these defective contact recovery systems. Accordingly, it is possible to remarkably improve a yield of stacked semiconductor devices. However, when a defective contact recovery circuit is used, an additional capacity is added to a signal line that should not be increased in capacity. Further, a chip area may disadvantageously be increased by a space for control circuits. Similarly, a recovery system using the same signal contact groups arranged in parallel to each other may also have an increased chip area. Accordingly, the aforementioned defective contact recovery systems need to be used in consideration of properties required for signal pins, advantages, and disadvantages.

Next, a stacked semiconductor device to which the aforementioned defective contact recovery systems are applied will be described below.

EXAMPLE 2

Figure 5:
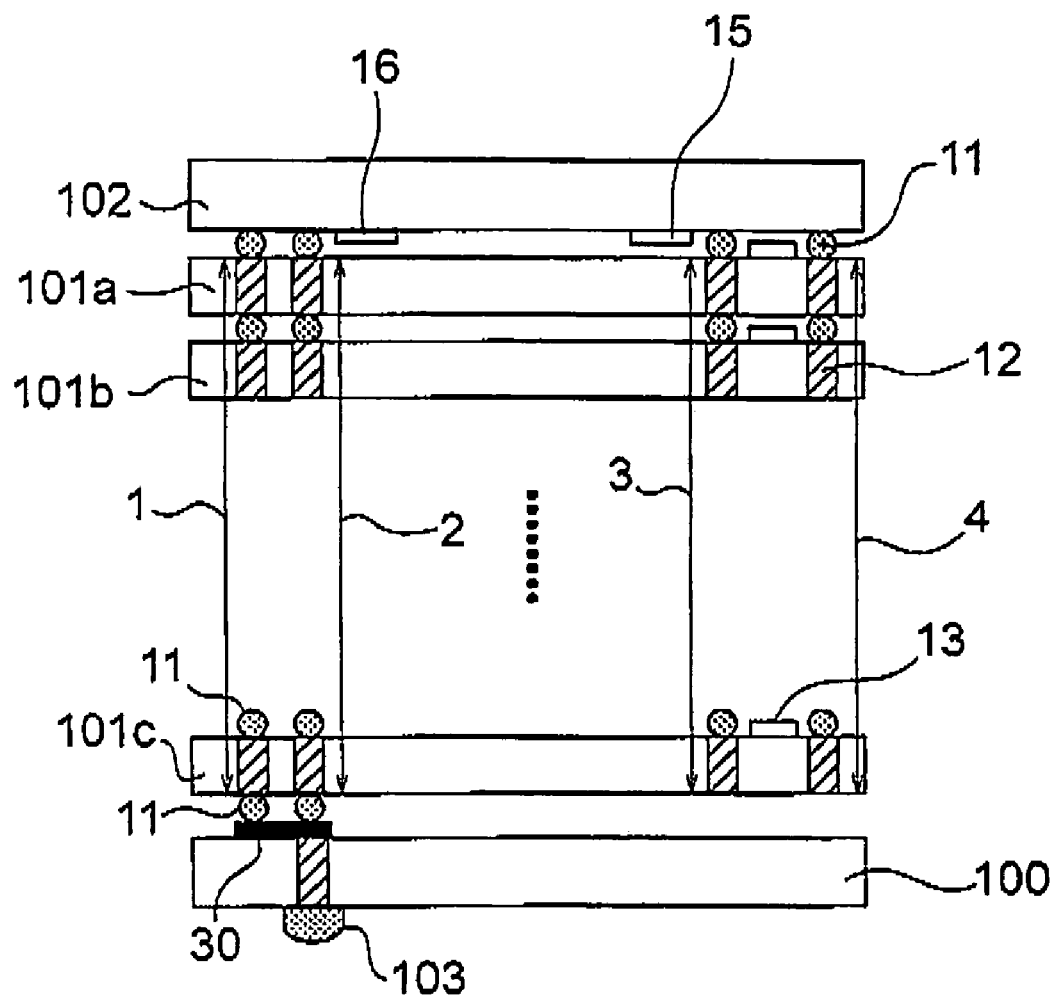
FIG. 5 is a cross-sectional view showing a stacked semiconductor device in Example 2.
Figure 6:
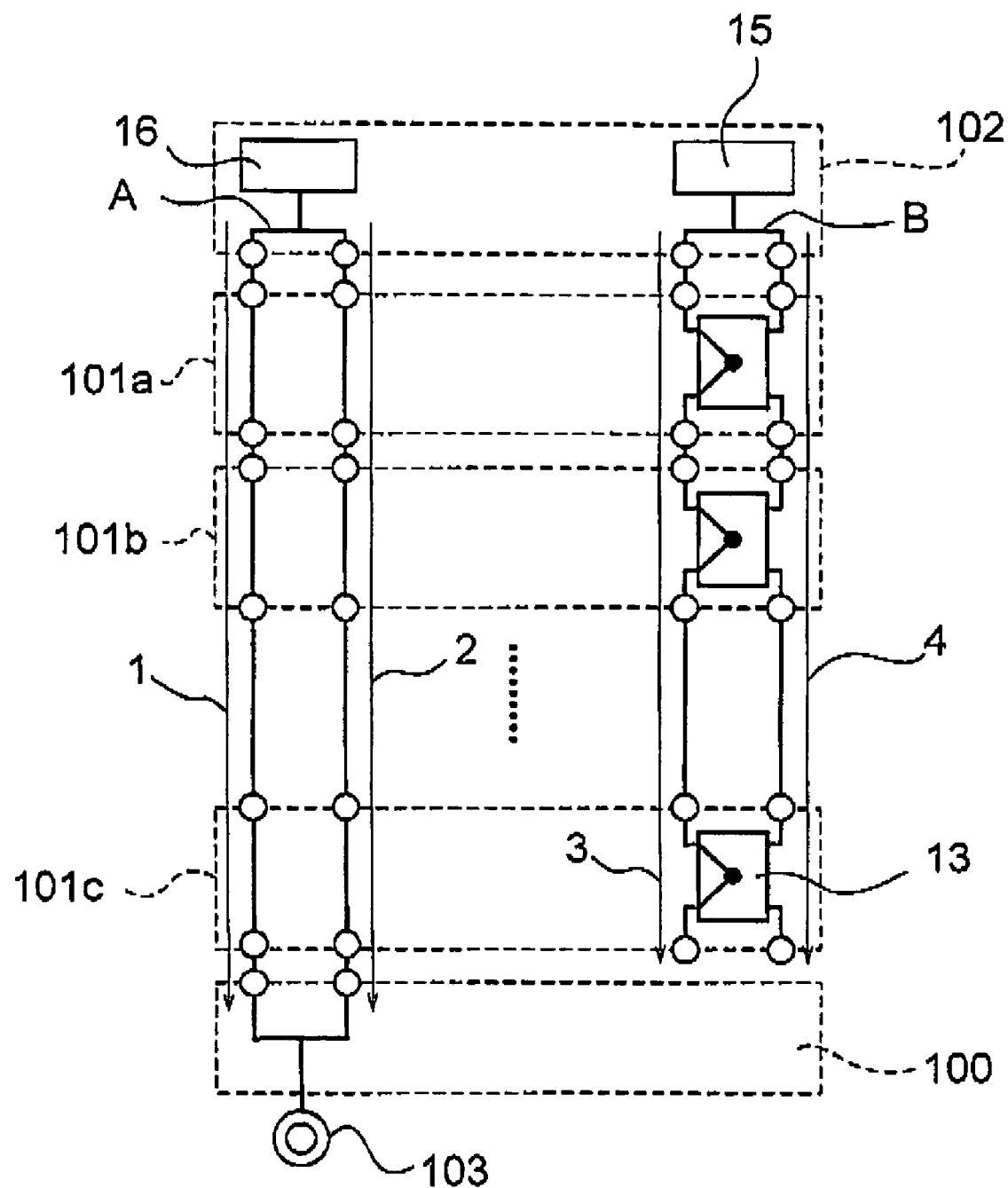
FIG. 6 is an explanation diagram showing signal paths in the stacked semiconductor device shown in FIG. 5.
Figure 7:
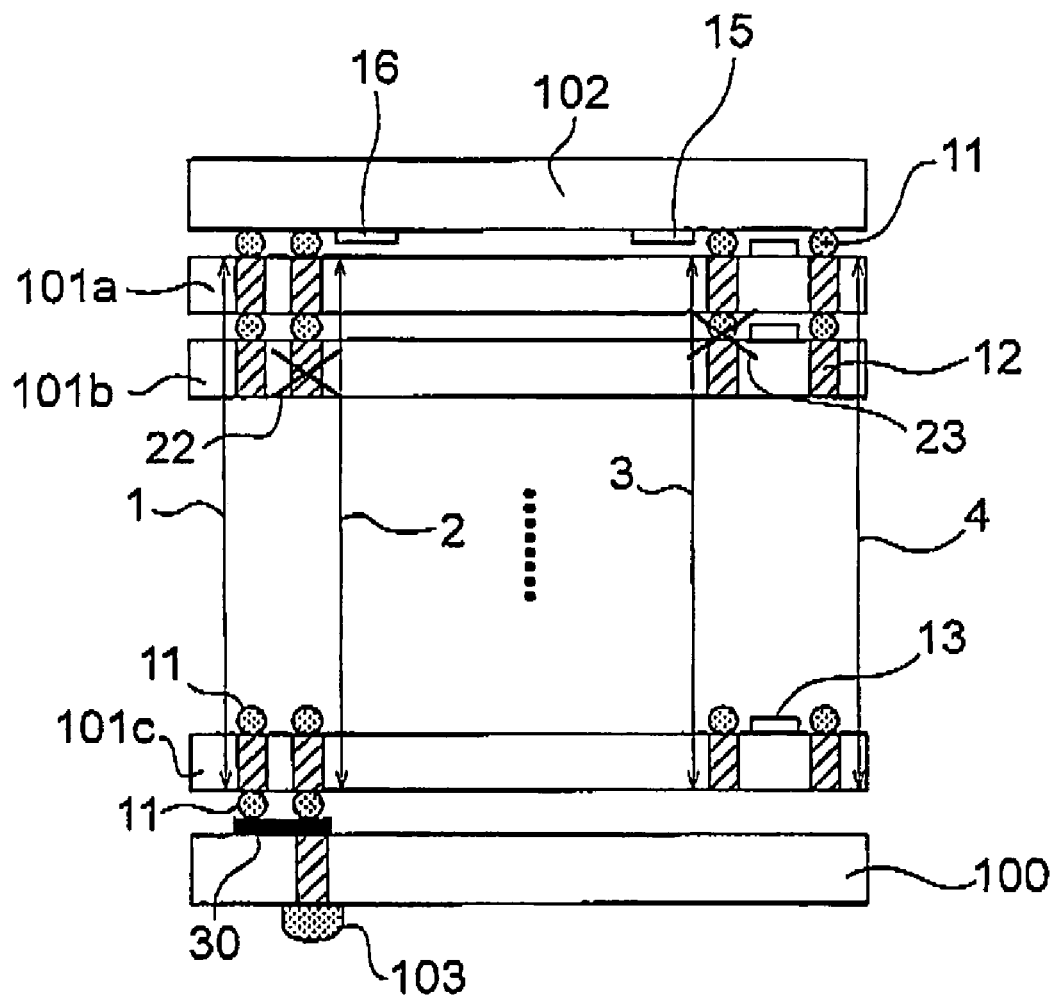
FIG. 7 is a cross-sectional view showing locations of defective contacts in the stacked semiconductor device shown in FIG. 5.
Figure 8:
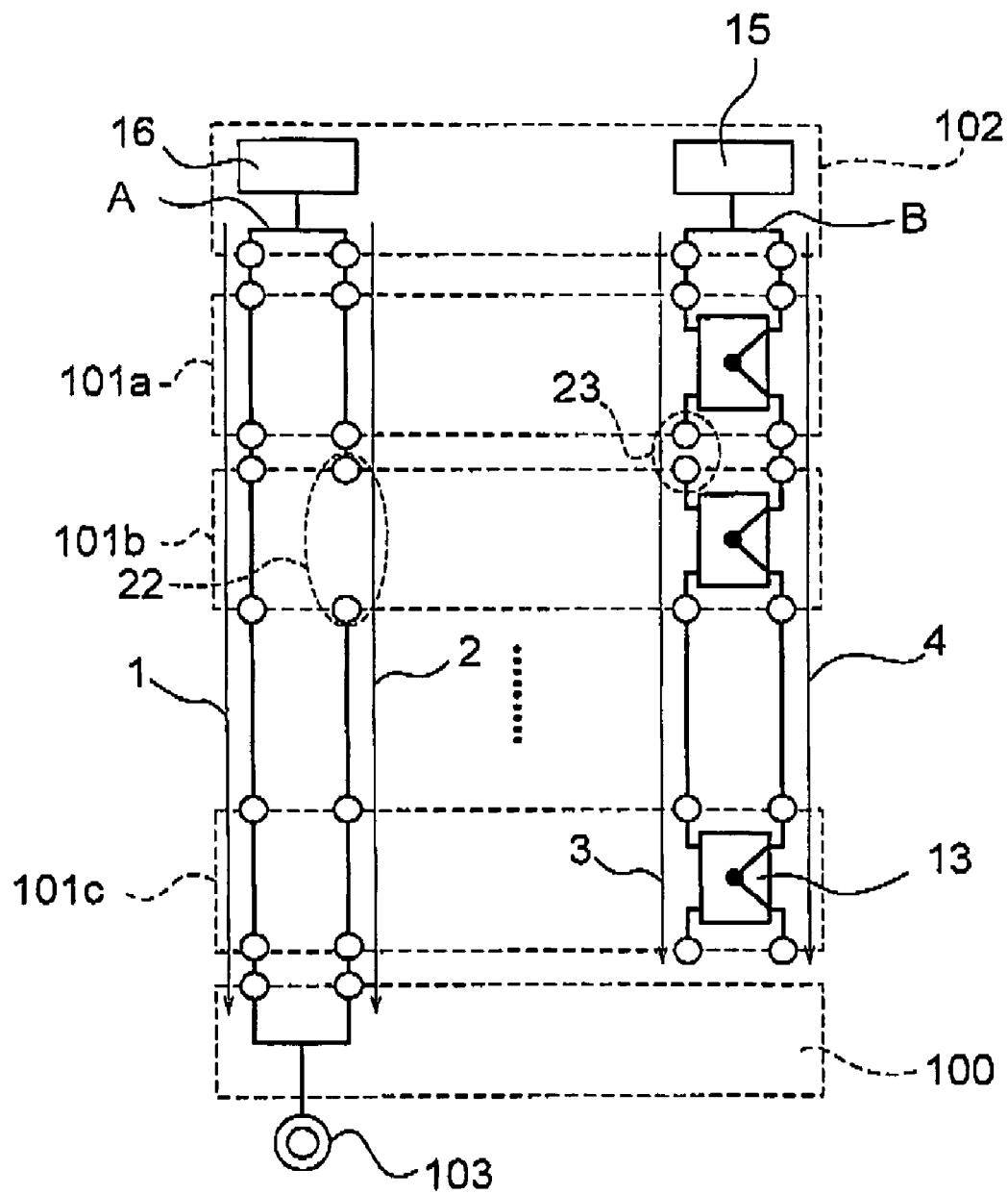
FIG. 8 is an explanation diagram showing signal paths in the stacked semiconductor device shown in FIG. 7.

A stacked semiconductor device to which a defective contact recovery system is applied will be described as Example 2 with reference to FIGS. 5 to 8. FIG. 5 is a cross-sectional view showing a stacked semiconductor device in Example 2. FIG. 6 is an explanation diagram showing signal paths in the stacked semiconductor device shown in FIG. 5. FIG. 7 is a cross-sectional view showing locations of defective contacts in the stacked semiconductor device shown in FIG. 5. FIG. 8 is an explanation diagram showing signal paths in the stacked semiconductor device shown in FIG. 7.

As shown in FIG. 5, the stacked semiconductor memory device comprises an interface chip 102, a plurality of core chips 101a to 101c, and an interposer 100. Each of the core chips 101a, 101b, and 101c has a large number of memory cells such as DRAMs, a circuit for storing data in the memory cells, and a control circuit for the memory cells and the aforementioned circuit. Specifically, each of the core chips 101a, 101b, and 101c includes circuits such as a sense amplifier and an address decoder, a control circuit for adjusting operation timing of those circuits, a circuit required for determination of non-defective products in a wafer test for core chips, a defective contact recovery circuit 13, and an input/output circuit for the interface chip 102. Further, each of the core chips 101a, 101b, and 101c has through electrodes 12 extending through the chip.

The interface chip 102 includes an input/output circuit 15 for an address buffer, a refresh counter, and the core chips 101a to 101c, an input/output circuit 16 for an external terminal 103, and the like. The interposer 100 has an external terminal 103 formed on a rear face of the interposer 100, a metal interconnection 30 formed on a substrate, and a means for connecting a contact portion of the core chip 101c to the external terminal 103 via the metal interconnection 30 on the substrate.

The core chips 101a, 101b, and 101c are stacked on the interposer 100. The interface chip 102 is stacked on the uppermost core chip 101a. The respective chips are connected to each other by contact portions 11 between the chips and the through electrodes 12. The connection produces signal paths 1 to 4 each formed by the contact portions 11 between the chips and the through electrodes 12. The signal paths 1 and 2 are connected to the external terminal 103 formed on the interposer 100. The signal paths 3 and 4 are used to transmit and receive signals between the core chips 101a to 101c and between the interface chip 102 and the core chips 101a to 101c.

In this example, a parallel arrangement recovery system in which signal paths are arranged in parallel to each other is-used in signal paths that have a small number of total signals and particularly should not be increased in capacity, i.e., in the signal paths 1 and 2 extending from the external terminal 103. A defective contact recovery circuit for switching is used in signal paths having a large number of internal signals, i.e., in the signal paths 3 and 4. The defective contact recovery circuit allows one auxiliary through electrode to be provided for a plurality of primarily used through electrodes. With such a recovery circuit, it is possible to prevent a great increase of an area of the stacked semiconductor device.

The different defective contact recovery systems are used in the stacked semiconductor device for the following reasons. For example, it is assumed the stacked semiconductor device is a DDR3 type DRAM. In a DDR3 type DRAM, a data signal is inputted into and outputted from the external terminal 103 at a very high speed as serial consecutive data having a burst length of 8 bits. The data having a burst length of 8 bits are subjected to a serial-parallel conversion in the interface chip 102. The data having a burst length of 8 bits are inputted into and outputted from the core chip 101 in parallel. Accordingly, in short, the internal signals can operate at a frequency one eighth of a frequency of the external signals. A very high speed operation is required for the DRAM because serial data having a burst length of 8 bit are transmitted to the external terminal with a data width of 64 bits. On the other hand, the internal signals having a burst length of 8 bit are expanded and subjected to parallel processing. Thus, the number of signals becomes large (64×8=512). However, a very high speed operation is not required.

As described above, with regard to data signals in a DRAM, signals to the external terminal require a serial data transfer and a very high speed operation. However, the number of the signals to the external terminal is small. On the other hand, signals to the core chips require a parallel data transfer, and the number of the signals is large. However, the signals to the core chips do not require a very high speed operation. Thus, an optimal defective contact recovery system is different between the signal paths 1, 2 and the signal paths 3, 4. Different defective contact recovery systems are used according to the number of signals and a processing speed. In this manner, it is possible to obtain a suitable recovery efficiency with a small increase of an area of the stacked semiconductor device. The foregoing description relates to a DRAM but is applicable to other semiconductor devices.

Next, a flow of signals in this example will be described. In FIG. 6, an external input/output circuit 16 and an internal signal input/output circuit 15 are provided on the interface chip 102. An external output signal A outputted from the external input/output circuit 16 is outputted via two paths of the signal path 1 and the signal path 2 from the external terminal 103 formed on the interposer 100. An internal signal B outputted from the internal signal input/output circuit 15 is supplied to the core chips 101a, 101b, and 101c via the signal path 3, which is selected by defective contact recovery circuits 13 formed on the respective core chips. Each of the defective contact recovery circuits 13 is initially set so as to select the signal path 3. Accordingly, the signal path 4 is not used at an initial stage.

It is assumed that defective contacts 22 and 23 are located in the middle of the signal paths as shown in FIG. 7. The defective contact 22 is located in the signal path 2 within a through electrode in the core chip 101b. Because each core chip was tested on its front face (a surface on which the defective contact recovery circuit 13 is formed), the defective contact 22 was not detected in the test. Accordingly, the core chip 101b was determined as a non-defective product. After determination of non-defective product, the core chip 101b was transferred to a stacking process and used for the stacked semiconductor device. The defective contact 23 was produced in a contact portion 11 between the core chips 101a and 101b during the stacking process.

Operation in the case where the stacked semiconductor device has these defective contacts 22 and 23 will be described with reference to FIG. 8. In FIG. 8, the external output signal A outputted from the external input/output circuit 16 formed on the interface chip 102 cannot use the signal path 2 because of the defective contact 22 in the core chip 101b. In this case, the external output signal A uses the other signal path 1 arranged in parallel to the signal path 2 so that it is outputted from the external terminal 103 formed on the substrate of the interposer 100. The internal signal B outputted from the internal signal input/output circuit 15 formed on the interface chip 102 cannot use the signal path 3 because of the defective contact 23 between the core chips 101a and 101b. In this case, the defective contact recovery circuit 13 switches the signal path 3 to the signal path 4 so as to ensure a data transfer between the interface chip 102 and the core chips. Thus, both of the defective contacts 22 and 23 are recovered, so that the stacked semiconductor device becomes a non-defective product.

In the defective contact recovery circuit of this example, one switchable signal path is set for one signal path. However, the defective contact recovery circuit is not limited to the illustrated example. For example, one switchable signal path may be set for two signal paths. Further, one switchable signal path may be set for three or more signal paths. Thus, with the defective contact recovery system, even if a defective contact is produced, the defective contact can be recovered by a recovery signal path. Accordingly, it is possible to remarkably improve a yield of stacked semiconductor devices.

The number of signal contact groups and the yield are considered in stacked semiconductor devices of DDR3 type DRAMs. For external input/output signals, it is assumed that address and command signals have 30 lines and that data input/output signals have 64 lines. In this case, the external input/output signals have 94 lines in total. For internal signals, it is assumed that address and command signals have 30 lines. Since data input/output signals are subjected to parallel processing, the number of lines for the data input/output signals is 64×8=512. Thus, the internal signals have 542 lines in total. In consideration of a power source, a ground, and other signals, the number of through electrodes per layer is 900. When eight core chips are stacked, the total number of contact portions is about 7,200.

For brevity's sake, a yield is compared and calculated with respect to only 752 (94×8) contact portions relating to the external input/output signal in about 7,200 contact portions. A yield is calculated on the assumption that defective contacts are randomly produced with a probability of 0.1%. In a case of no defective contact recovery means, an assembly yield of stacked semiconductor devices is about 40%. In a case where a defective contact recovery means is provided only for external input/output signals, an assembly yield of stacked semiconductor devices can be maintained at 95%. Thus, even if a defective contact recovery means is provided only for the external input/output signals, it is possible to remarkably improve a yield of stacked semiconductor devices.

The aforementioned assembly yield is obtained by calculating a probability at which defective contacts are produced at 752 (94×8) contact portions for the external input/output signals in all 7,200 contact portions. Specifically, random numbers between 1 and 7,200 are generated 100,000 times. The assembly yield uses a probability that the generated random numbers are between 1 and 752. Thus, the calculated yield relates to only an external input/output signal system. When data input/output signals for external input/output signals have 16 lines, not 64 lines, an assembly yield of about 65% is obtained by a similar calculation in a case of no defective contact recovery means for the external input/output signals. In a case where a defective contact recovery means according to the present invention is provided for the external input/output signals, an assembly yield of stacked semiconductor devices can be maintained at 95%, which is close to a normal assembly yield.

Further, a recovery system using a defective contact recovery circuit is applied to the signal paths from the internal signal input/output circuit. In this case, one switchable auxiliary signal path can be provided for n lines (n: an integer larger than 0) of the signal paths. The number n is determined by a probability of generation of defective contacts. The number n is set to a small value when a probability of generation of defective contacts is high. The number n is set to a large value when a probability of generation of defective contacts is low. It is possible to reduce areas of a switch transistor, an ESD protective element, and a control circuit by optimizing the number of the defective contact recovery circuits. By properly selecting the number n, the number of the defective contact recovery circuits can be reduced so as to obtain a suitable recovery efficiency.

In the stacked semiconductor device of this example, different defective contact recovery systems are used as defective contact recovery means. The total number of signals in the signal paths 1 and 2 connected to the external terminal is small. A very high speed operation is required for the signal paths 1 and 2 because of a serial data transfer. Thus, the signal paths 1 and 2 should not be increased in capacity. Accordingly, a parallel arrangement recovery means in which the signal paths 1 and 2 are arranged in parallel to each other is used for the signal paths 1 and 2. The internal signals are transmitted via a parallel data transfer, and the number of internal signals is large. The signal paths 3 and 4 are used for the internal signals. Accordingly, a defective contact recovery circuit is used for the signal paths 3 and 4. In the defective contact recovery circuit system, a recovery circuit is used so that one auxiliary through electrode is provided for a plurality of primarily used through electrodes. By adopting the defective contact recovery circuit, it is possible to prevent a great increase of an area of the stacked semiconductor device. Thus, when two or more types of defective contact recovery means are used in the same stacked semiconductor device, it is possible to achieve processing speeds required for the respective signals, reduce an increase of an area of the stacked semiconductor device, and obtain a suitable recovery efficiency.

EXAMPLE 3

Figure 9:
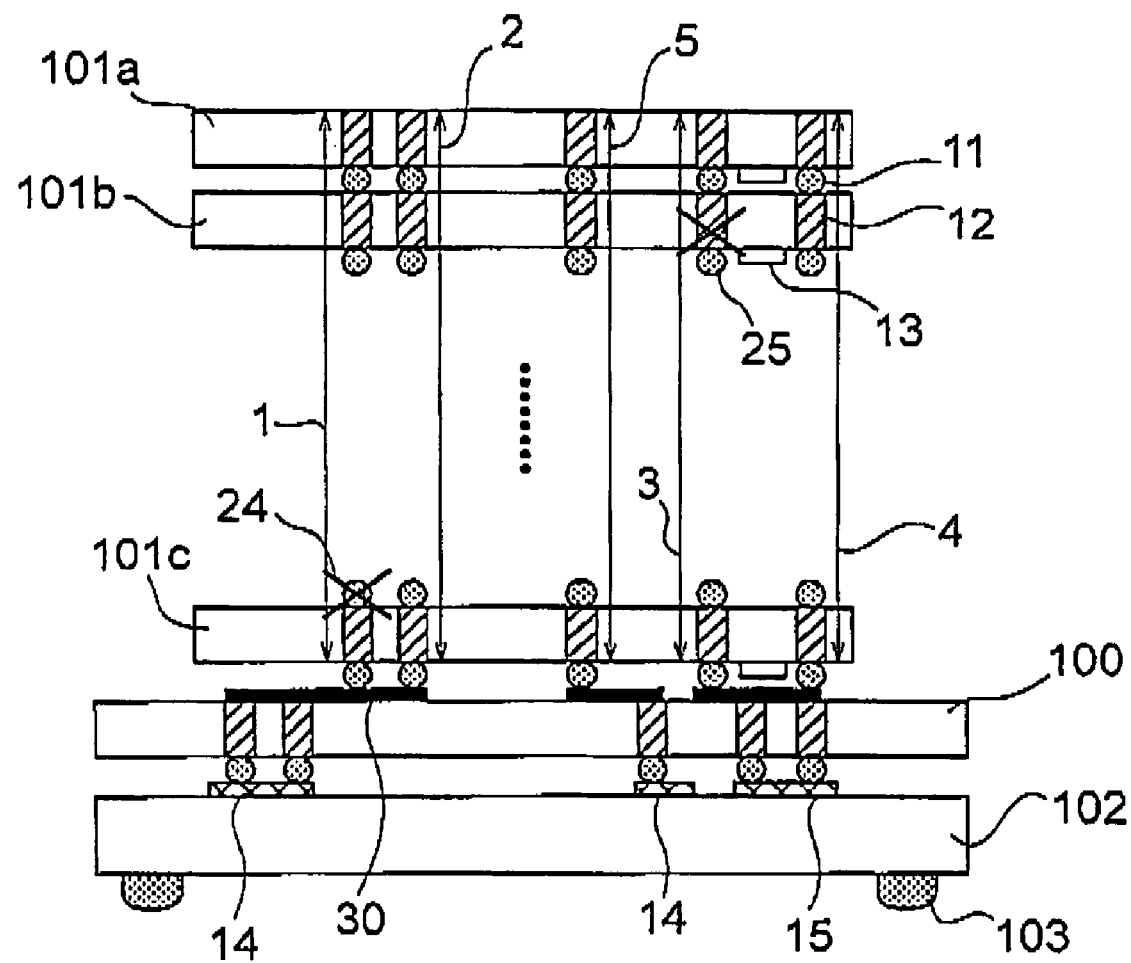
FIG. 9 is a cross-sectional view showing a stacked semiconductor device in Example 3.
Figure 10:
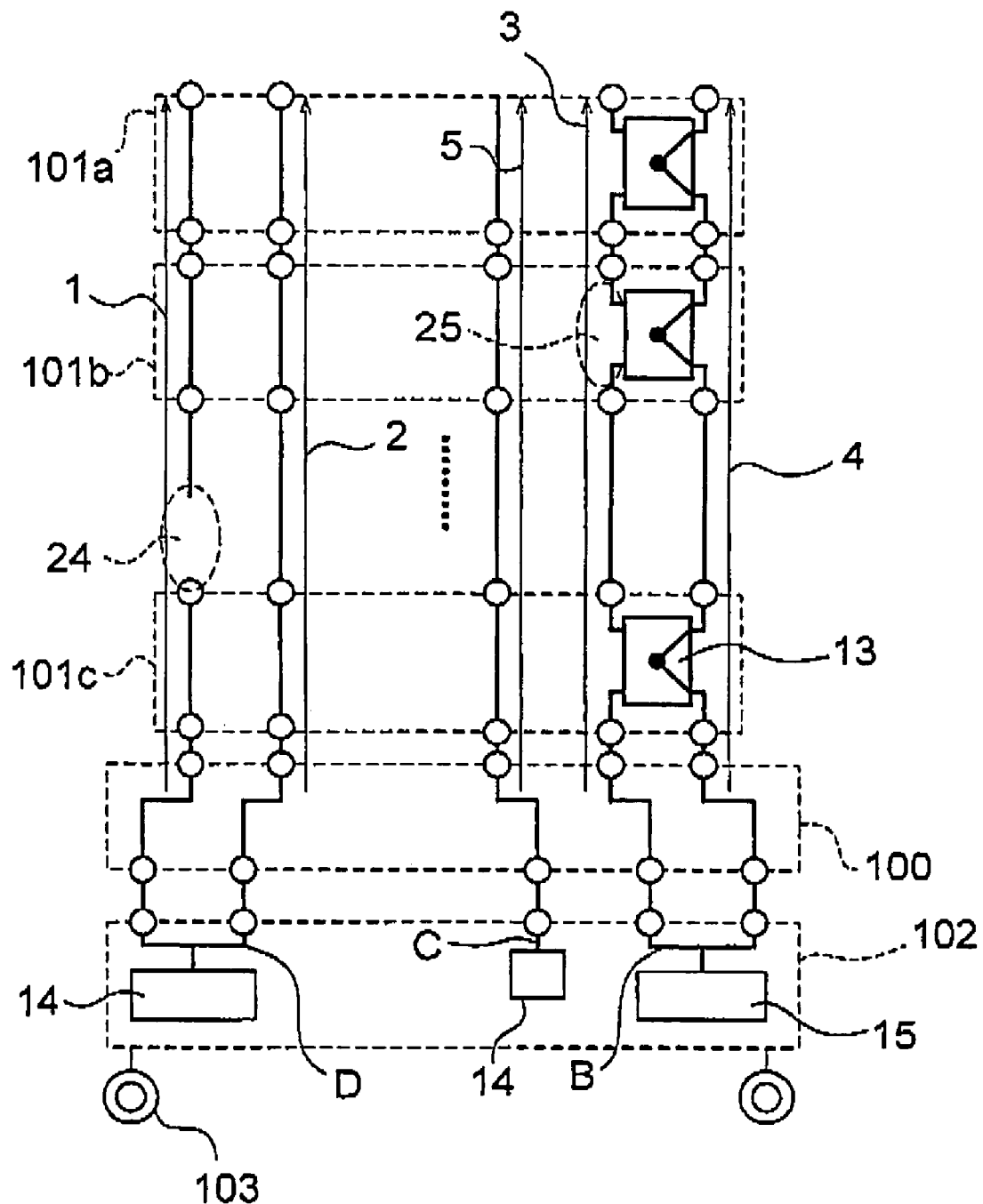
FIG. 10 is an explanation diagram showing signal paths in the stacked semiconductor device shown in FIG. 9.

A stacked semiconductor device to which the defective contact recovery means is applied will be described as Example 3 with reference to FIGS. 9 and 10. FIG. 9 is a cross-sectional view showing a stacked semiconductor device in Example 3. FIG. 10 is an explanation diagram showing signal paths in the stacked semiconductor device shown in FIG. 9.

As shown in FIG. 9, Example 3 differs from Example 1 in a stacked structure of an interface chip, core chips, and an interposer. In Example 3, an interposer 100 is stacked on an interface chip 102. Core chips 101a, 101b, and 101c are stacked on the interposer 100. The core chips 101a, 101b, and 101c are connected to each other by contact portions 11 between the chips and through electrodes 12. The connection produces signal paths 1 to 5 each formed by the contact portions 11 between the chips and the through electrodes 12. The signal paths 1 to 5 are used to transmit and receive signals between the core chips 101a to 101c and between the interface chip 102 and the core chips 101a to 101c. The interposer 100 serves as a substrate for signal arrangement conversion between the interface chip 102 and the core chips 101a to 101c.

The stacked semiconductor device will be described with reference to a flow diagram shown in FIG. 10. An internal signal D is outputted from an internal signal generation circuit 14 formed on the interface chip 102. The internal signal D is supplied to the core chips via two paths of the signal path 1 and the signal path 2. Specifically, a parallel arrangement system is used as a defective contact recovery means for the internal signal D. When a defective contact 24 is produced in the signal path 1 at a contact portion 11 between the chips, the signal path 1 is interrupted by the defective contact 24. However, a signal can be transmitted to the core chips via the other signal path 2.

Further, a defective contact recovery circuit 13 is provided for an internal signal B outputted from an internal signal input/output circuit 15 formed on the interface chip 102. The internal signal B is supplied to the core chips via the signal path 3. If a defective contact 25 is produced in the signal path 3 within a through electrode of the core chip 101b, the signal path 3 is interrupted by the defective contact 25. However, the defective contact recovery circuit 13 switches the signal path 3 into the signal path 4 so as to recover the defective contact 25. No defective contact recovery means is provided in the signal path 5. The number of signals that do not directly cause defective operation, such as test mode signals, is small and has a low probability of generation of defective contacts. Accordingly, it is possible to reduce an influence on a decrease of a non-defective product rate without any defective contact recovery means, which would increase an area in the chips.

Here, use of the internal signals D and B will be described. The internal signals D have about 100 lines of signals including a data signal from an external terminal 103, an address signal, a command signal, and a control signal for controlling operation timing. The internal signals B are used to transmit and receive data between the core chips. The total number of the internal signals B depends on an arrangement of a semiconductor device. In a case where a numerical calculation is performed in a semiconductor device, the total number of the internal signals B is as large as 2,000. Optimal defective contact recovery systems are designed according to the above purposes. Since the internal signals D have a small number of lines, it is desirable to employ a recovery system in which the same signal contact groups are arranged in parallel to each other, rather than a recovery system using a defective contact recovery circuit. In the internal signals B, a plurality of signal groups concurrently operate for a data transfer having a predetermined unit. Accordingly, a recovery system using a defective contact recovery circuit with one recovery signal contact group for a plurality of signal contact groups is effective in reducing a chip area.

In the stacked semiconductor device of this example, different defective contact recovery systems are used as defective contact recovery means. The total number of signals in the signal paths 1 and 2 connected to the external terminal is small. A very high speed operation is required for the signal paths 1 and 2 because of a serial data transfer. Thus, the signal paths 1 and 2 should not be increased in capacity. Accordingly, a parallel arrangement recovery means in which the signal paths 1 and 2 are arranged in parallel to each other is used for the signal paths 1 and 2. The internal signals are transmitted via a parallel data transfer, and the number of internal signals is large. The signal paths 3 and 4 are used for the internal signals. Accordingly, a defective contact recovery circuit is used for the signal paths 3 and 4. In the defective contact recovery circuit system, a recovery circuit is used so that one auxiliary through electrode is provided for a plurality of primarily used through electrodes. By adopting the defective contact recovery circuit, it is possible to prevent a great increase of an area of the stacked semiconductor device. Further, no defective contact recovery system is used for the signal path 5. Thus, when two or more types of defective contact recovery means are used in the same stacked semiconductor device, it is possible to achieve processing speeds required for the respective signals, reduce an increase of an area of the stacked semiconductor device, and obtain a suitable recovery efficiency.

Although certain preferred embodiments and examples of the present invention have been shown and described in detail, the present invention is not limited to the illustrated examples. It should be understood that various changes and modifications may be made therein without departing from the scope of the present invention. Further, the illustrated examples include inventions at various stages, and thus various inventions can be extracted from proper combinations of the disclosed elements. For example, inventions can be extracted from this disclosure as long as desired effects can be achieved even if some of the disclosed elements are eliminated.

What is claimed is:

1. A stacked semiconductor device, comprising:
    core chips,
    an interface chip,
    an interposer, and
    a defective contact recovery means which has an auxiliary recovery signal path for signal paths,
    wherein the signal paths are formed by through electrodes extending through the core chips and contact portions between the through electrodes of the core chips.

2. The stacked semiconductor device according to claim 1, wherein:
    the defective contact recovery means comprises a parallel arrangement system in which the auxiliary recovery signal path is provided for one line of the signal paths.

3. The stacked semiconductor device according to claim 2, wherein:
    the parallel arrangement system is applied to a signal inputted from an exterior of the stacked semiconductor device.

4. The stacked semiconductor device according to claim 2, wherein:

the parallel arrangement system is applied to a signal transmitted as serial data between an external terminal and the interface chip.

5. The stacked semiconductor device according to claim 1, wherein: the defective contact recovery means comprises a defective contact recovery circuit system in which the auxiliary recovery signal path is provided for n lines (n: an integer larger than 0) of the signal paths, and the signal paths are switched by a defective contact recovery circuit.

6. The stacked semiconductor device according to claim 5, wherein:

the defective contact recovery circuit is mounted on the core chips.

7. The stacked semiconductor device according to claim 6, wherein:

the defective contact recovery circuit includes a latch circuit for memorizing a defective contact portion, a change-over switch, and a control circuit.

8. The stacked semiconductor device according to claim 7, wherein:

the defective contact recovery circuit system is applied to a signal having a large number of lines between the interface chip and the core chips.

9. The stacked semiconductor device according to claim 7, wherein:

the defective contact recovery circuit system is applied to a signal which is subjected to a parallel conversion between the interface chip and the core chips and is to be transmitted to an exterior of the stacked semiconductor device.

10. The stacked semiconductor device according to claim 1, wherein:

different defective contact recovery means are used for the signal paths in the stacked semiconductor device.

11. The stacked semiconductor device according to claim 10, wherein:

a parallel arrangement system is used as the defective contact recovery means for a signal path to an input/output circuit connected to an external terminal, and a defective contact recovery circuit is used as the defective contact recovery means for a signal path to an input/output circuit connected to the core chips.

12. The stacked semiconductor device according to claim 10, wherein:

the core chips have a memory cell of a DRAM and a peripheral circuit of the memory cell, the interface chip has an external input/output circuit connected to an external terminal and an internal signal input/output circuit connected to the core chips, a parallel arrangement system is used as the defective contact recovery means for a signal path to the external input/output circuit, and a defective contact recovery circuit is used as the defective contact recovery means for a signal path to the internal signal input/output circuit.

13. The stacked semiconductor device according to claim 12, wherein:

the stacked semiconductor device comprises a DDR type DRAM operable to input and output a data signal having a burst length of at least 2.

\* \* \* \* \*